United States Patent
Fuchino

(10) Patent No.: US 8,248,731 B2
(45) Date of Patent: Aug. 21, 2012

(54) ELECTRICAL CONNECTION BETWEEN PIEZOELECTRIC ACTUATOR AND HEAD SUSPENSION

(75) Inventor: Hideki Fuchino, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 276 days.

(21) Appl. No.: 12/644,277

(22) Filed: Dec. 22, 2009

(65) Prior Publication Data

US 2010/0165516 A1    Jul. 1, 2010

(30) Foreign Application Priority Data

Dec. 25, 2008  (JP) ................................ 2008-331409

(51) Int. Cl.
  *G11B 5/55* (2006.01)
  *G11B 5/56* (2006.01)
(52) U.S. Cl. ................ 360/245.8; 310/323.06; 310/363; 310/364; 310/365; 360/245.9; 360/294.4
(58) Field of Classification Search ....... 360/245.8–246, 360/264.2, 294.4; 310/323.06, 363–366
See application file for complete search history.

(56) References Cited

U.S. PATENT DOCUMENTS

| 7,167,344 B2* | 1/2007 | Nakagawa et al. ........ 360/294.4 |
| 2008/0229842 A1* | 9/2008 | Ohtsuka et al. ................. 73/777 |

FOREIGN PATENT DOCUMENTS

| JP | 2002-050140 | 2/2002 |
| JP | 2003-061371 | 2/2003 |

* cited by examiner

*Primary Examiner* — Allen Heinz
(74) *Attorney, Agent, or Firm* — Jordan and Hamburg LLP

(57) ABSTRACT

An electrical connecting structure for a piezoelectric element enables wiring to the piezoelectric element to be carried out without deteriorating the productivity and reliability of the piezoelectric element. The electrical connecting structure is formed by facing a common electrode of the piezoelectric element to a terminal that supplies power to the common electrode and by injecting a conductive adhesive into a through hole, which is formed substantially at the center of the piezoelectric element, from an opening of the through hole that is on the opposite side of the common electrode, thereby securing electrical connection between the terminal and the common electrode of the piezoelectric element.

19 Claims, 8 Drawing Sheets

External view of wiring member seen from below head suspension

External view of wiring member seen from piezoelectric element

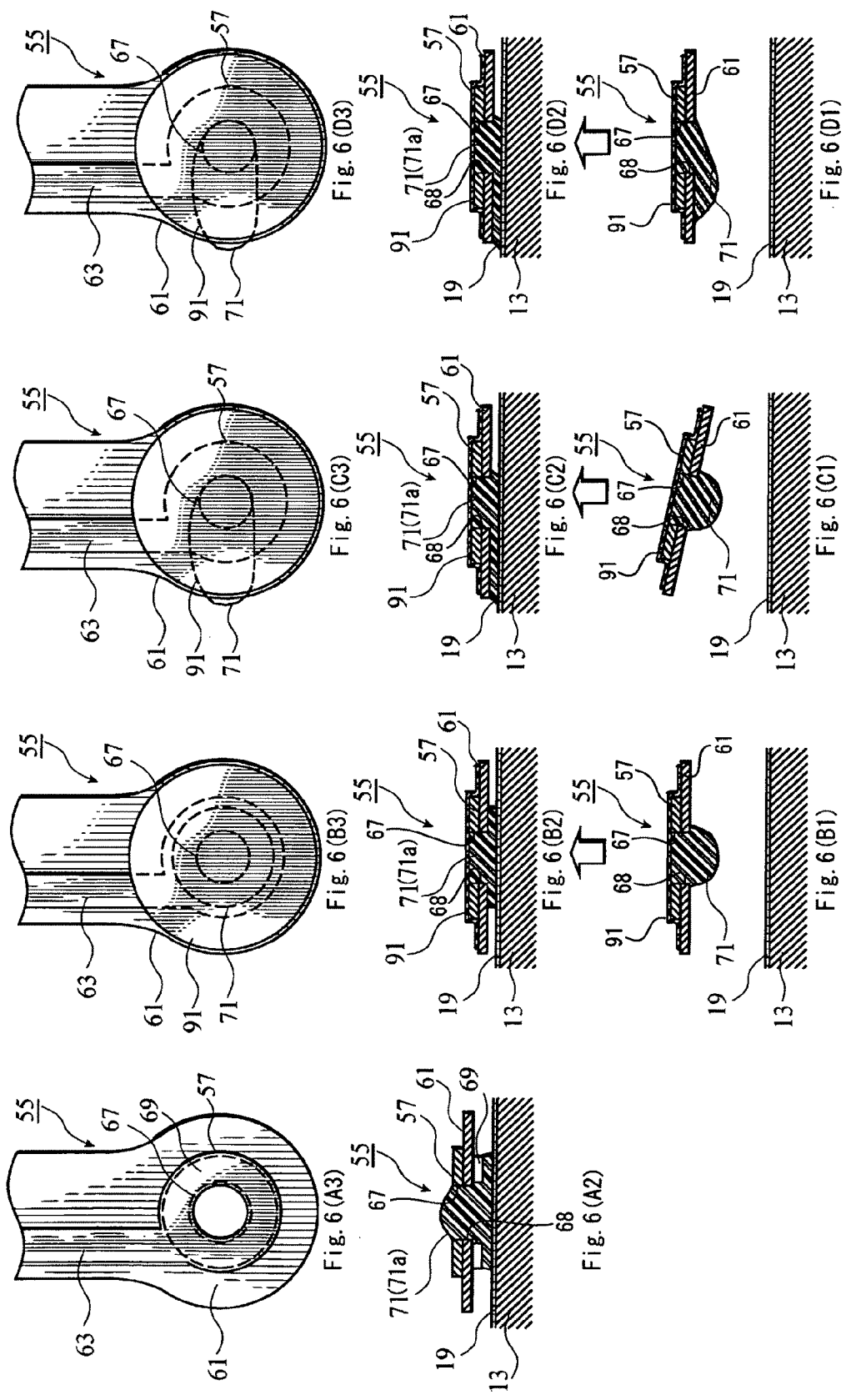

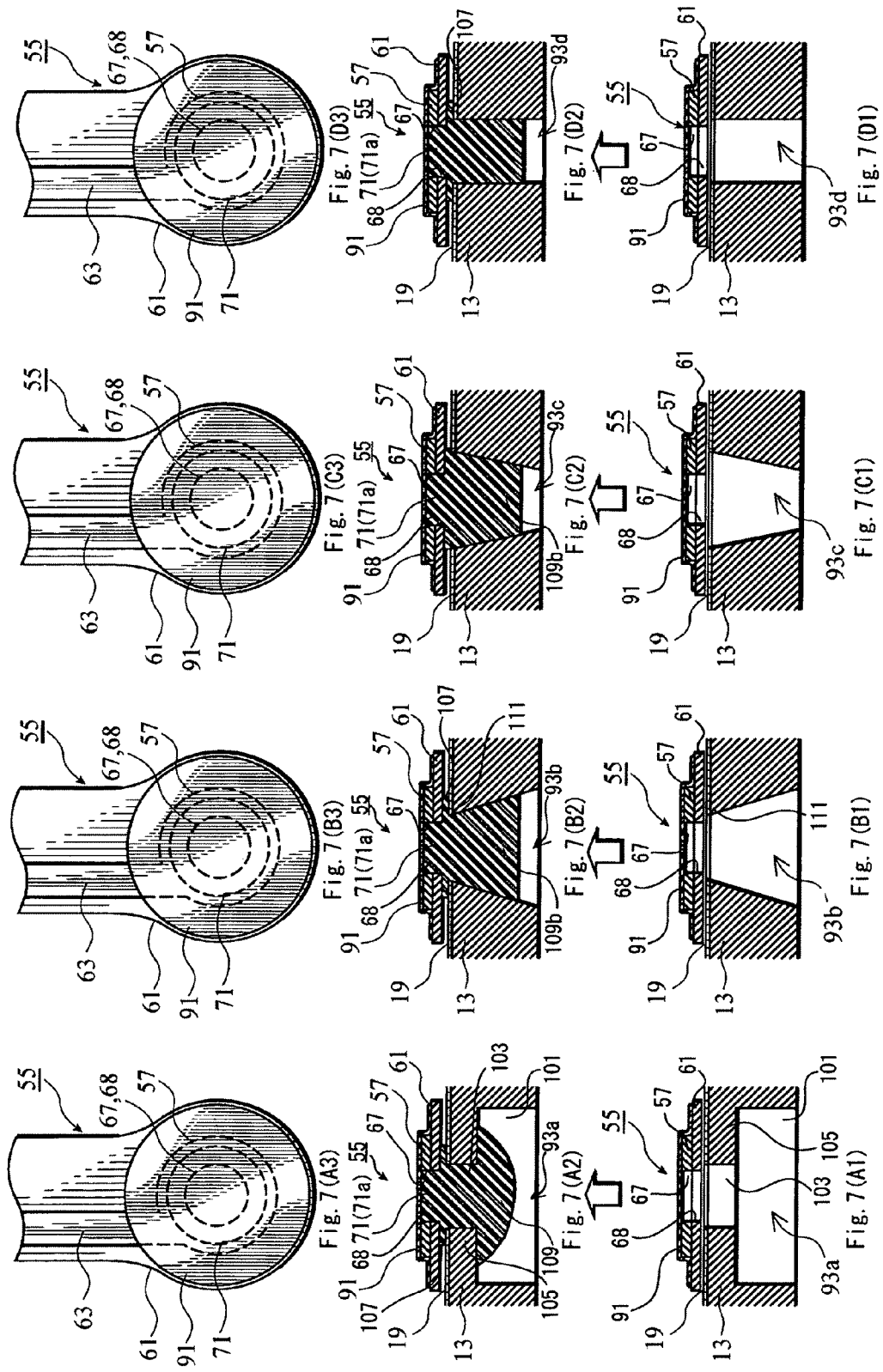

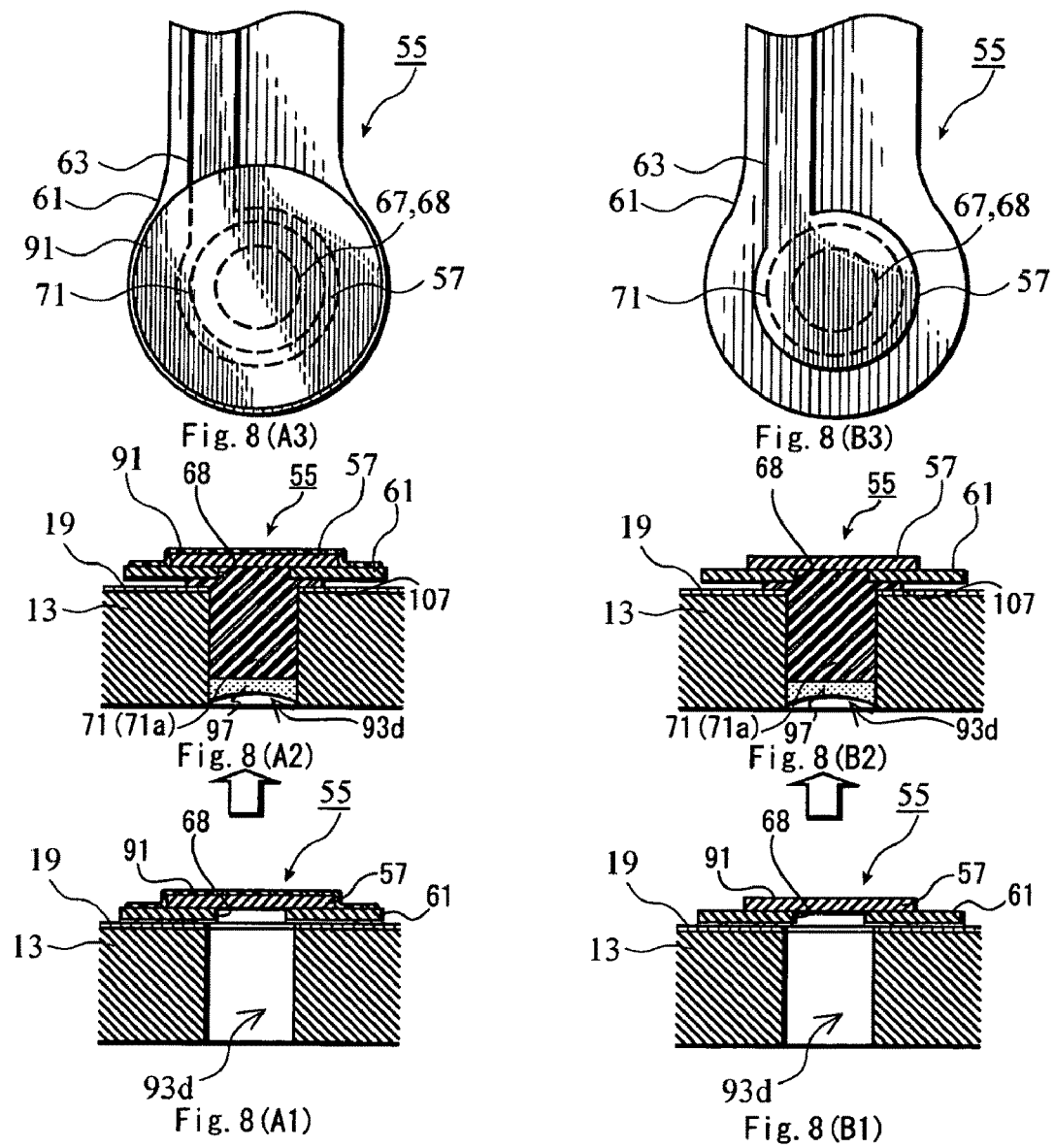

ELECTRICAL CONNECTION BETWEEN PIEZOELECTRIC ACTUATOR AND HEAD SUSPENSION

BACKGROUND OF THE INVENTION

1. Field of the Invention

The present invention relates to an electrical connecting structure and electrical connecting method for a piezoelectric element that deforms in response to a voltage applied thereto, a piezoelectric actuator that incorporates the piezoelectric element to drive an objective part according to deformation of the piezoelectric element, and a head suspension provided with the piezoelectric actuator. In particular, the present invention relates to an electrical connecting structure and electrical connecting method for a piezoelectric element, capable of conducting wiring work for the piezoelectric element in such a way as to prevent the piezoelectric element from being damaged and secure the reliability of the piezoelectric element, a piezoelectric actuator employing such a piezoelectric element, and a head suspension employing such a piezoelectric actuator.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The magnetic disk drives are rapidly expanding market and improving performance, and accordingly, they are strongly required to increase their storage capacities. The storage capacity of a magnetic disk drive increases if the storage capacity of each magnetic disk contained in the magnetic disk drive is increased.

The storage capacity or recording density of a magnetic disk will increase, without changing the diameter thereof, if the number of tracks per inch (TPI) on the magnetic disk is increased. For this, the width of each track on the magnetic disk must be narrowed. To handle such narrow tracks on the magnetic disk, a magnetic head of a head suspension installed in the magnetic disk drive must conduct a precise positioning operation in a direction across the tracks, i.e., a sway direction. For realizing the precise positioning operation, an actuator capable of accurately moving and positioning the magnetic head in a very small area is needed.

To meet the need, the applicant of the present invention has proposed in Japanese Unexamined Patent Application Publication No. 2002-50140 a head suspension for a disk drive. The head suspension includes a base plate, a connection plate having a hinge thinner than the base plate, a load beam provided with a flexure and a slider, and a pair of piezoelectric elements.

This related art employs a dual actuator system that involves, for a precise positioning purpose, a voice coil motor and the piezoelectric elements made of, for example, PZT (lead zirconate titanate). The piezoelectric elements minutely drive a front end of the load beam or only the slider in a widthwise direction (sway direction) of the head suspension.

Compared with a single actuator system employing only a voice coil motor, the dual actuator system employing the voice coil motor and piezoelectric elements more precisely positions a magnetic head attached to a front end of the head suspension.

An important issue for the head suspension employing the dual actuator system is how to supply electricity to the piezoelectric elements.

A technique to approach this issue is disclosed in Japanese Unexamined Patent Application Publication No. 2003-61371 (in particular, FIGS. 9 and 10 thereof). This related art arranges a pair of wires on a head suspension. One of the wires is connected through wire bonding to a base electrode and the other wire is connected through wire bonding to an exposed part of the top face of each piezoelectric element.

This related art has a risk of cracking the piezoelectric element because the wire bonding process applies a local stress on the piezoelectric element to secure a bonding strength. If the wire bonding process is carried out with a reduced force not to crack the piezoelectric element, the bonding strength will be insufficient to deteriorate the reliability of electric connection to the piezoelectric element.

Instead of the wire bonding, a conductive adhesive such as conductive paste may be used to electrically connect each piezoelectric element to a wiring part such as a terminal part. The wire bonding or the conductive paste, however, causes a swell protruding from an end face of the piezoelectric element or an inclination of the terminal part, to make a clearance with respect to a magnetic disk insufficient.

In this way, it is very difficult to carry out wiring to the piezoelectric elements without damaging the piezoelectric elements or deteriorating the reliability thereof.

SUMMARY OF THE INVENTION

An object of the present invention is to provide an electrical connecting structure and electrical connecting method for a piezoelectric element, capable of providing the piezoelectric element with electrical connection without deteriorating the productivity and reliability of the piezoelectric element. Also provided by the present invention are a piezoelectric actuator employing the piezoelectric element and a head suspension employing the piezoelectric actuator.

In order to accomplish the objects, a first aspect of the present invention provides an electrical connecting structure for a piezoelectric element, the piezoelectric element being arranged between a base and head of an object and configured to minutely move the head in a sway direction when deformed with an applied voltage, the electrical connecting structure connecting an electrode of the piezoelectric element formed on a first end face of the piezoelectric element to a terminal used to apply a voltage to the piezoelectric element. The electrical connecting structure includes a through hole formed through the piezoelectric element from the electrode on the first end face of the piezoelectric element to a second end face of the piezoelectric element that is opposite to the first end face, and a conductive part formed from within the through hole to the terminal, to join the electrode and terminal together and electrically connect the electrode and terminal to each other.

A second aspect of the present invention provides an electrical connecting method for the electrical connecting structure of the first aspect. The method includes facing the terminal to the electrode on the first end face of the piezoelectric element, and injecting a liquid conductive adhesive into the through hole from the second end face side of the piezoelectric element and hardening the injected liquid conductive adhesive to join the electrode and terminal together.

A third aspect of the present invention provides a piezoelectric actuator that employs the electrical connecting structure of the first aspect.

A fourth aspect of the present invention provides a head suspension including the piezoelectric actuator of the third aspect, a base plate, a load beam attached to the base plate, and a flexure attached to the load beam, the piezoelectric actuator being arranged between the base plate and the flexure, to minutely move a front end of the load beam in a sway direction when deformed with an applied voltage.

According to the first and second aspects of the present invention, the electrode of the piezoelectric element and the terminal are electrically connected to each other with the conductive adhesive without a deviation of the conductive adhesive or nonparallelism between the piezoelectric element and the terminal when adhered to each other. Namely, these aspects prevent the terminal and piezoelectric element from being inclined to each other when adhered to each other, or a clearance between the terminal and the piezoelectric element from becoming uneven.

The through hole of the piezoelectric element is used not only for injecting a conductive adhesive between the electrode of the piezoelectric element and the terminal but also for holding an excessive part of the conductive adhesive. This provides a margin in controlling an injection quantity of conductive adhesive and makes it easy to automate the injection of conductive adhesive. Further, these aspects prevent the excessive conductive adhesive from oozing to cause a short circuit.

It is preferable that the through hole of the piezoelectric element has a shape selected from a group consisting of a cylinder having a uniform diameter, a combination of cylinders having different diameters, and a truncated cone having gradually changing diameters.

If the through hole has a cylindrical shape, the through hole is easy to form with a sufficient strength. If the through hole has a truncated conical shape, a conductive adhesive may easily be injected into the through hole even from an oblique direction. If the through hole is a combination of cylindrical shapes having different diameters, both the above-mentioned advantages are provided and a volume for receiving an excessive conductive adhesive is controllable.

It is preferable that the terminal is arranged on an electric insulating layer that is arranged to face the electrode on the first end face of the piezoelectric element and that the electric insulating layer has a hole to expose the terminal to the electrode on the first end face of the piezoelectric element.

It is also preferable that the electric insulating layer is formed on a wiring member that includes a conductive base, an electric insulating layer formed on the conductive base, and wiring formed on the electric insulating layer, the terminal is arranged on the wiring member, and the conductive base of the wiring member is partly removed at a location that faces the electrode on the first end face of the piezoelectric element.

These items prevent the electrode of the piezoelectric element from electrically contacting the wiring member such as the flexure at locations other than the location of the terminal, thereby preventing the generation of noise due to electrical contact. Even if the piezoelectric element vibrates, the flexibility of the wiring member and flexure prevents the connection between the electrode of the piezoelectric element and the terminal from being broken.

It is preferable that the through hole of the piezoelectric element has a larger diameter than the hole of the electric insulating layer and that the terminal has a hole that communicates with, is concentric with, and has the same diameter as the hole of the electric insulating layer.

According to the third and fourth aspects of the present invention, the piezoelectric actuator and head suspension provide the effect of the first aspect.

BRIEF DESCRIPTION OF THE DRAWINGS

FIGS. 5(a) and 5(b) are views illustrating a wiring member of the head suspension of FIG. 1, in which FIG. 5(a) is a view seen from below the head suspension and FIG. 5(b) is a view seen from the piezoelectric element embedded in the head suspension;

FIGS. 6(A2) and 6(A3) are views illustrating an electrical connecting structure for a piezoelectric element according to a comparative example 1, in which FIG. 6(A2) is a sectional view after connection and FIG. 6(A3) is a plan view after connection;

FIGS. 6(B1) to 6(B3) are views illustrating an electrical connecting structure for a piezoelectric element according to a comparative example 2, in which FIG. 6(B1) is a sectional view before connection, FIG. 6(B2) is a sectional view after connection, and FIG. 6(B3) is a plan view after connection;

FIGS. 6(C1) to 6(C3) are views illustrating the electrical connecting structure for a piezoelectric element according to the comparative example 2 with a wiring member and piezoelectric element being in nonparallelism, in which FIG. 6(C1) is a sectional view before connection, FIG. 6(C2) is a sectional view after connection, and FIG. 6(C3) is a plan view after connection;

FIGS. 6(D1) to 6(D3) are views illustrating the electrical connecting structure for a piezoelectric element according to the comparative example 2 with an injected conductive adhesive being biased, in which FIG. 6(D1) is a sectional view before connection, FIG. 6(D2) is a sectional view after connection, and FIG. 6(D3) is a plan view after connection;

FIGS. 7(A1) to 7(A3) are views illustrating an electrical connecting structure according an embodiment of the present invention, in which FIG. 7(A1) is a sectional view before injecting a conductive adhesive, FIG. 7(A2) is a sectional view after injecting the conductive adhesive, and FIG. 7(A3) is a plan view after the adhesive injection;

FIGS. 7(B1) to 7(B3) are views illustrating an electrical connecting structure according another embodiment of the present invention, in which FIG. 7(B1) is a sectional view before injecting a conductive adhesive, FIG. 7(B2) is a sectional view after injecting the conductive adhesive, and FIG. 7(B3) is a plan view after the adhesive injection;

FIGS. 7(C1) to 7(C3) are views illustrating an electrical connecting structure according to still another embodiment of the present invention, in which FIG. 7(C1) is a sectional view before injecting a conductive adhesive, FIG. 7(C2) is a sectional view after injecting the conductive adhesive, and FIG. 7(C3) is a plan view after the adhesive injection;

FIGS. 7(D1) to 7(D3) are views illustrating an electrical connecting structure according to still another embodiment of the present invention, in which FIG. 7(D1) is a sectional view before injecting a conductive adhesive, FIG. 7(D2) is a sectional view after injecting the conductive adhesive, and FIG. 7(D3) is a plan view after the adhesive injection;

FIGS. 8(A1) to 8(A3) are views illustrating an electrical connecting structure according to still another embodiment of the present invention, in which FIG. 8(A1) is a sectional view before injecting a conductive adhesive, FIG. 8(A2) is a sectional view after injecting the conductive adhesive, and FIG. 8(A3) is a plan view after the adhesive injection;

FIGS. 8(B1) to 8(B3) are views illustrating an electrical connecting structure according to still another embodiment of the present invention, in which FIG. 8(B1) is a sectional view before injecting a conductive adhesive, FIG. 8(B2) is a sectional view after injecting the conductive adhesive, and FIG. 8(B3) is a plan view after the adhesive injection.

DETAILED DESCRIPTION OF EMBODIMENTS

An electrical connecting structure for a piezoelectric element according to the present invention achieves wiring to the piezoelectric element without deteriorating the productivity and reliability of the piezoelectric element. For this, the electrical connecting structure includes a through hole formed through the piezoelectric element from an electrode on a first end face of the piezoelectric element to a second end face of the piezoelectric element that is opposite to the first end face. A liquid conductive adhesive is injected into the through hole to join the electrode of the piezoelectric element with a terminal used to apply a voltage to the electrode.

Electrical connecting structures, electrical connecting methods, piezoelectric actuators, and head suspensions according to embodiments of the present invention will be explained in detail with reference to the drawings.

First, a head suspension as an object according to an embodiment of the present invention will be explained with reference to FIGS. 1 to 4.

Figure 1:
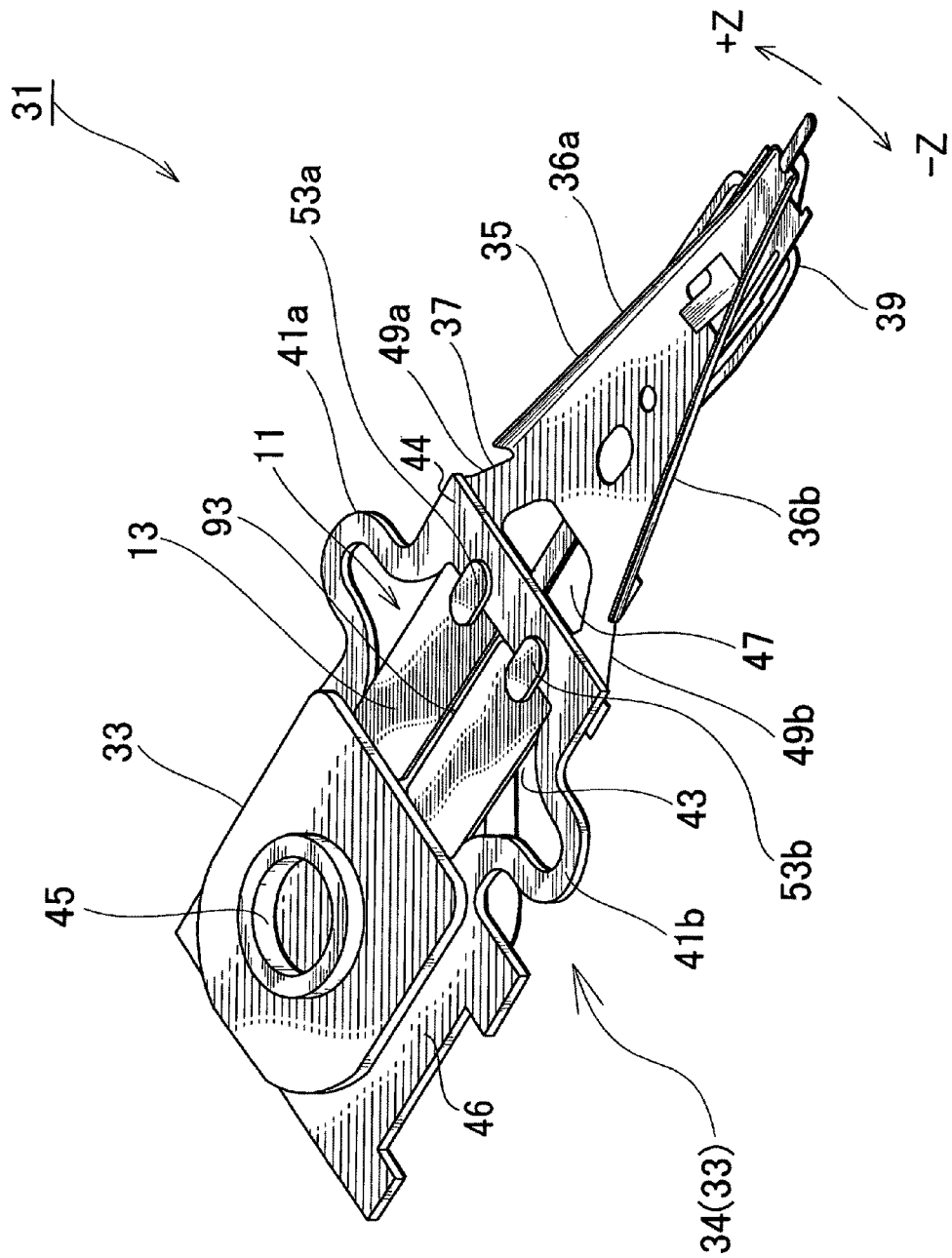
FIG. 1 is a perspective view illustrating a head suspension according to an embodiment of the present invention.

FIG. 1 is a perspective view illustrating the head suspension according to the embodiment of the present invention.

As shown in FIG. 1, the head suspension 31 includes a base plate 33 to which a piezoelectric actuator 11 comprising a piezoelectric element 13 is attached, a load beam 35, a connection plate 37, and the like. The base plate 33 has an opening 43 in which the piezoelectric element 13 is arranged. The piezoelectric element 13 deforms in response to an applied voltage, to move a front end of the load beam 35 in sway directions (+Z and −Z directions indicated with arrows in FIG. 1), i.e., widthwise directions of the head suspension 31.

The base plate 33 is made of a metal plate such as a stainless steel plate having a thickness of about 150 to 200 µm. The base plate 33 may be made of light metal such as aluminum alloy or a clad material comprising light metal and stainless steel. Such a light material may reduce the inertia of the base plate 33, increase the resonant frequency of the head suspension 31 in the sway directions, and improve the tracing performance of the head suspension 31.

The base plate 33 has a boss 45 that is substantially circular. The base plate 33 is fixed through the boss 45 to a front end of an actuator arm (not illustrated) that is driven and turned by a voice coil motor (not illustrated).

The base plate 33 also functions as an attaching part of the piezoelectric element 13. Namely, the base plate 33 has an actuator plate 34 extending toward a front end of the head suspension 31. The actuator plate 34 has the opening 43 between a front end 44 thereof and a rear end 46 thereof, to accommodate the piezoelectric element 13. The actuator plate 34 includes a pair of flexible parts 41a and 41b each having a U-shape. The flexible parts 41a and 41b each are outwardly curved at a location corresponding to a side face of the piezoelectric element 13.

The actuator plate 34 and base plate 33 may be integral with each other or may be discrete parts. If they are discrete, a rear end of the actuator plate 34 is laid on the base plate 33 and is fixed thereto by proper fixing means such as laser welding. Instead, the actuator plate 34 may be omitted and the flexible parts 41a and 41b and opening 43 may directly be formed on the base plate 33.

Namely, the present invention covers not only a head suspension having both the base plate 33 and actuator plate 34 that are integral with each other or are discrete parts but also a head suspension having only the base plate 33 and no actuator plate 34. In the following explanation, the actuator plate 34 is considered to be integral with the base plate 33, for the sake of simplicity of explanation.

The load beam 35 has a flexure 39. The flexure 39 is made of a metal thin plate spring that is thinner and more precise than the load beam 35. A front end of the flexure 39 is provided with a slider (not illustrated) having a magnetic head. The load beam 35 is made of a stainless steel plate having a thickness of about 30 to 150 µm and is designed to apply load onto the slider.

The load beam 35 has longitudinal bent edges 36a and 36b to improve the rigidity of the load beam 35. A rear end of the load beam 35 is integral with the connection plate 37.

The load beam 35 may be made of light metal such as aluminum alloy or a clad material comprising light metal and stainless steel. Such a light material may reduce the inertia of the load beam 35, increase the resonant frequency of the head suspension 31 in the sway directions, and improve the tracing performance of the head suspension 31.

The connection plate 37 is made of a resilient metal plate having a thickness of about 30 µm and functioning as a hinge. A middle portion of the connection plate 37 has a hole 47 to reduce rigidity in a thickness direction. On each side of the hole 47 in the lateral direction, there are hinges 49a and 49b that bend in the thickness direction. A rear end of the connection plate 37 is laid on the bottom face of the front end 44 of the actuator plate 34 and is fixed thereto by proper fixing means such as laser welding.

The piezoelectric element 13 deforms according to a voltage applied state. The piezoelectric element 13 is embedded in the opening 43 of the base plate 33, to constitute the piezoelectric actuator 11.

Figure 2:
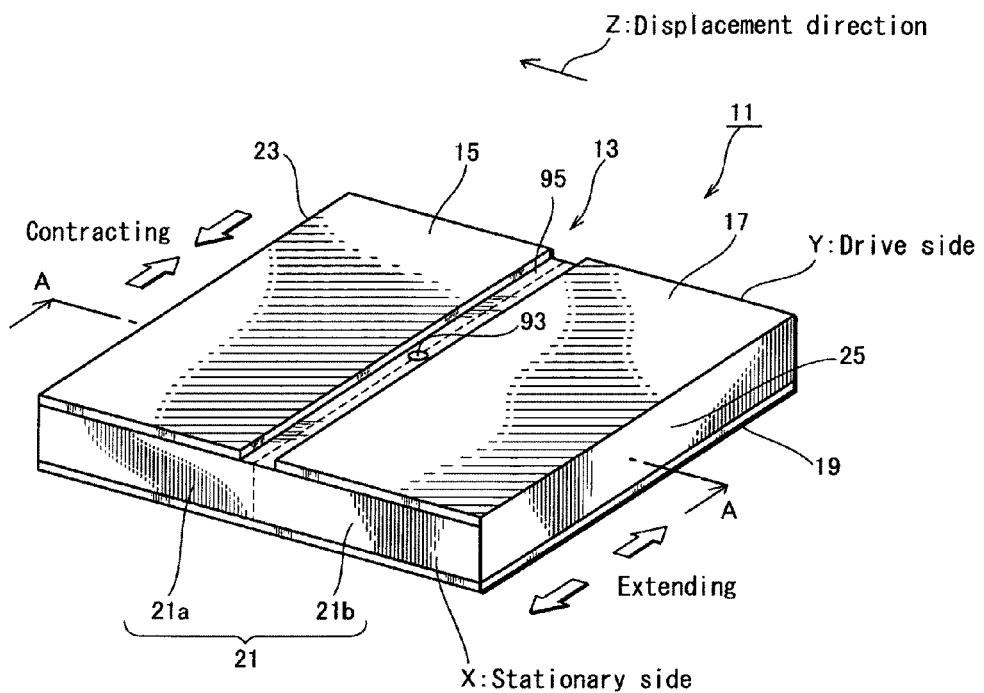
FIG. 2 is a perspective view illustrating a piezoelectric actuator according to an embodiment of the present invention, the piezoelectric actuator corresponding to that arranged on the head suspension of FIG. 1.
Figure 3:
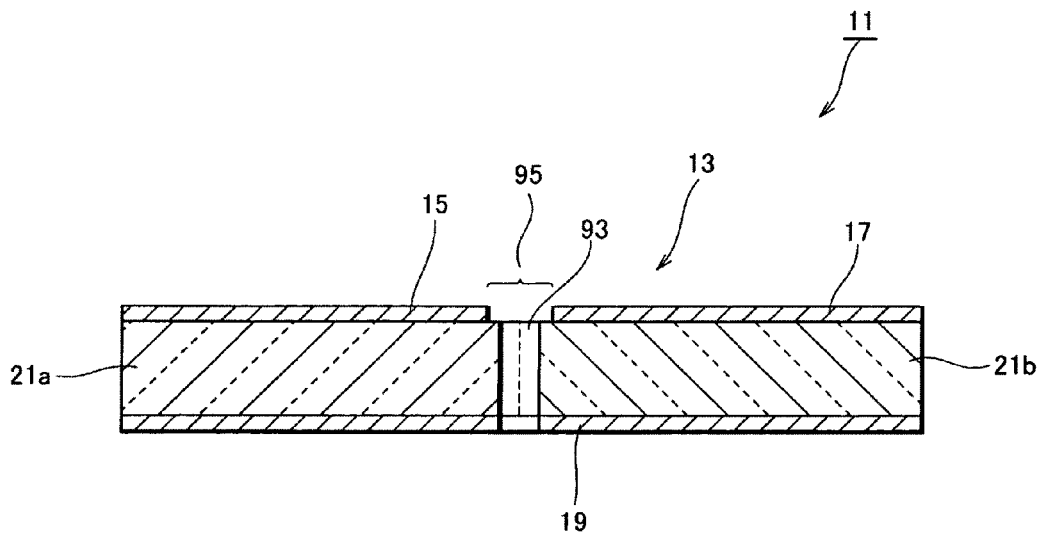
FIG. 3 is a sectional view taken along a line A-A of FIG. 2.

FIG. 2 is a perspective view illustrating the piezoelectric actuator 11 and FIG. 3 is a sectional view taken along a line A-A of FIG. 2.

In FIGS. 2 and 3, the piezoelectric actuator 11 comprises the piezoelectric element 13 substantially having a rectangular shape. The piezoelectric element 13 deforms in response to an applied voltage, and accordingly, the piezoelectric actuator 11 drives an objective part (the load beam 35). Deformation of the piezoelectric element 13 occurs when a voltage is applied thereto, or when the voltage applied thereto is stopped, or according to the level of a voltage applied thereto.

The piezoelectric element 13 includes first and second electrodes 15 and 17 that form a pair, a common electrode 19, and a piezoelectric material portion 21.

The first and second electrodes 15 and 17 are arranged in a common plane on a second end face of the piezoelectric element 13 and are separated from each other by a predetermined distance defined by a slit 95. The common electrode 19 is arranged on a first end face of the piezoelectric element 13 that is opposite to the second end face on which the first and second electrodes 15 and 17 are arranged.

The first and second electrodes 15 and 17 and common electrode 19 may be made of metal having a low contact resistance, such as gold (Au). The first and second electrodes 15 and 17 substantially have the same shape and size. The common electrode 19 is substantially equal in size and shape to a combination of the first and second electrodes 15 and 17 and slit 95.

The piezoelectric material portion 21 is arranged between the first and second electrodes 15 and 17 and the common electrode 19 and comprises a first piezoelectric material portion 21a and a second piezoelectric material portion 21b. The first piezoelectric material portion 21a deforms according to a voltage applied to the first electrode 15 and the second piezoelectric material portion 21b deforms according to a voltage applied to the second electrode 17. The first and second piezoelectric materials 21a and 21b are arranged adjacent to each other and are processed so that they are oppositely polarized. The first and second piezoelectric materials 21a and 21b are made of, for example, piezoelectric ceramics that are polarized with a polarization direction difference of 180 degrees.

Substantially at the center of the piezoelectric element 13, there is formed a through hole 93 in a thickness direction, to receive a conductive adhesive as will be explained later. The through hole 93 is in the slit 95 as illustrated in FIG. 3. The diameter of the through hole 93 is shorter than the width of the slit 95 and is in the range of, for example, 0.5 mm to 1.0 mm. The diameter of the through hole 93 may be wider than the width of the slit 95. The through hole 93 is formed from the second end face of the piezoelectric element 13 to the surface of the common electrode 19 through the first end face of the piezoelectric element 13.

Namely, the part of the common electrode 19 where the through hole 93 is formed is void to form an opening. The through hole 93 is formed in the piezoelectric element 13 by, for example, cutting or ultrasonic polishing. If the piezoelectric element 13 is made of piezoelectric ceramics, the through hole 93 may be formed before calcination.

Operation of the piezoelectric actuator 11 will be explained. In FIG. 2, a side of the piezoelectric element 13 marked with "X" is a stationary side, a side marked with "Y" is a drive side, the first and second electrodes 15 and 17 are grounded, and the common electrode 19 receives an applied voltage.

When receiving the voltage, the piezoelectric element 13 deforms into a trapezoid with an end face 23 of the first electrode 15 contracting and an end face 25 of the second electrode 17 extending. As a result, the piezoelectric element 13 moves in the direction Z (FIG. 2) by a very small distance, to move the part (load beam 35) attached to the drive side Y of the piezoelectric element 13.

When the common electrode 19 is grounded and the first and second electrodes 15 and 17 receive a voltage, the piezoelectric element 13 moves in the direction −Z (opposite to the direction Z of FIG. 2) by a minute distance, to move the part (load beam 35) attached to the drive side Y of the piezoelectric element 13.

The piezoelectric actuator 11 employed by the embodiment needs two electric systems, one for the first and second electrodes 15 and 17 and another for the common electrode 19. This configuration simplifies wiring to the piezoelectric element 13 and secures the reliability thereof.

The embodiment forms the piezoelectric actuator 11 with the single piezoelectric element 13, to reduce the number of parts, minimize parts management, and reduce the cost of the head suspension 31.

Figure 4:
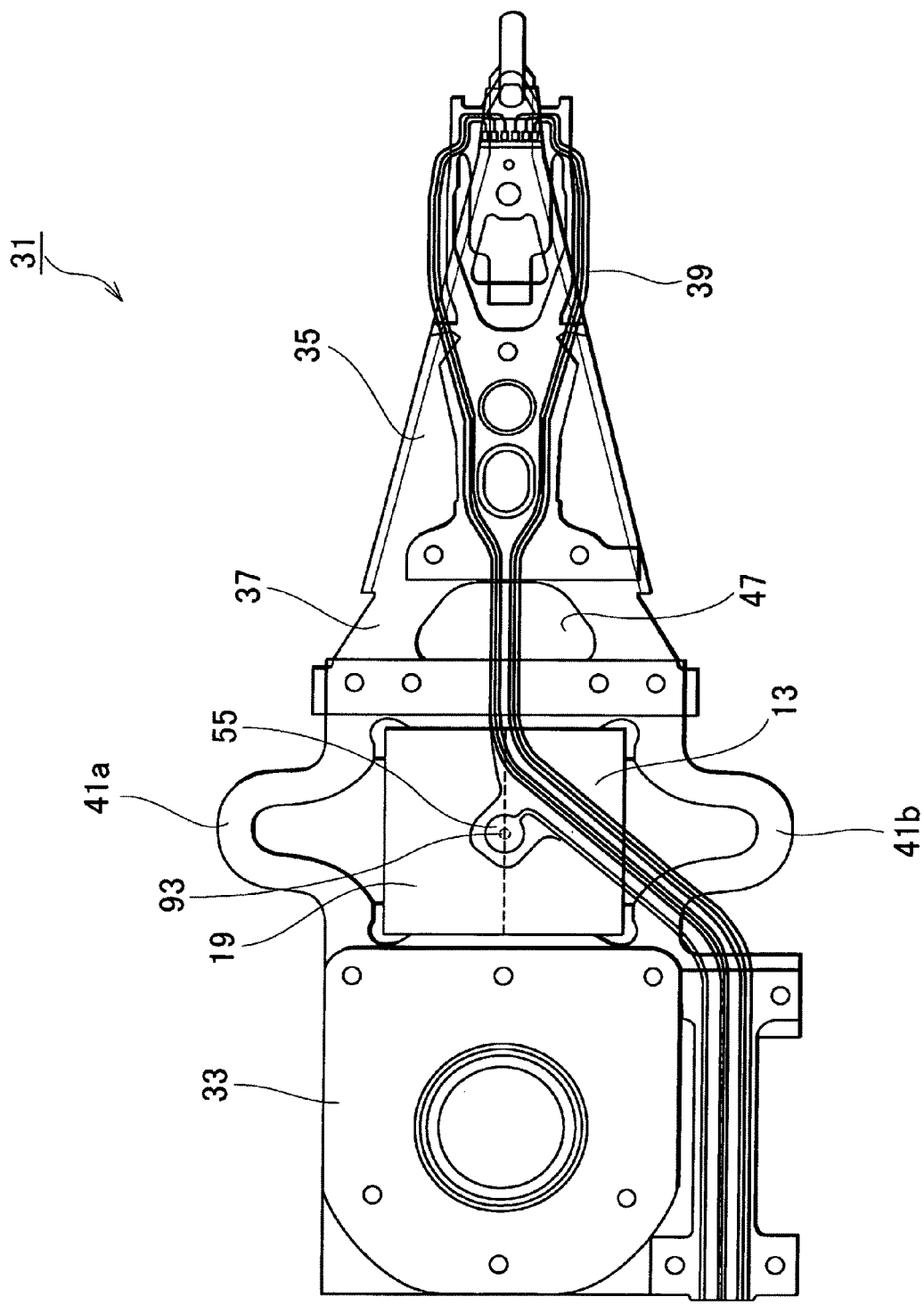
FIG. 4 is a back view illustrating the head suspension of FIG. 1.

FIG. 4 is a back view illustrating the head suspension 31.

In FIGS. 1 to 4, the opening 43 of the actuator plate 34 accommodates the piezoelectric element 13 with the first and second electrodes 15 and 17 being on top and the common electrode 19 being at the bottom.

Front and rear sides 44 and 46 of the actuator plate 34 are partly etched along the opening 43 to improve adhesiveness between the opening 43 and the piezoelectric element 13. On the opposite side of the flexure 39, i.e., on the opposite side of a disk, conductive adhesives 53a and 53b are applied between the front side 44 of the actuator plate 34 and the first and second electrodes 15 and 17 of the piezoelectric element 13, as illustrated in FIG. 1. Through the conductive adhesives 53a and 53b, the first and second electrodes 15 and 17 are electrically connected to the actuator plate 34. The common electrode 19 is connected through the electrical connecting structure of the present invention (to be explained later) to a terminal 57 of the flexure 39.

Between the piezoelectric element 13 and the front and rear edges of the opening 43, there is a nonconductive adhesive layer having a proper thickness. The adhesive layer effectively transfers a deformation (displacement) of the piezoelectric element 13 to the load beam 35 and secures electric insulation between the common electrode 19 of the piezoelectric element 13 and the base plate 33. A part where the actuator plate 34 of the base plate 33 overlaps the connection plate 37 corresponds to the drive side Y of the piezoelectric actuator 11.

Next, electrical connecting structures and electrical connecting methods for the piezoelectric element 13 according to embodiments of the present invention and their operation and effect will be explained.

Figure 5A:
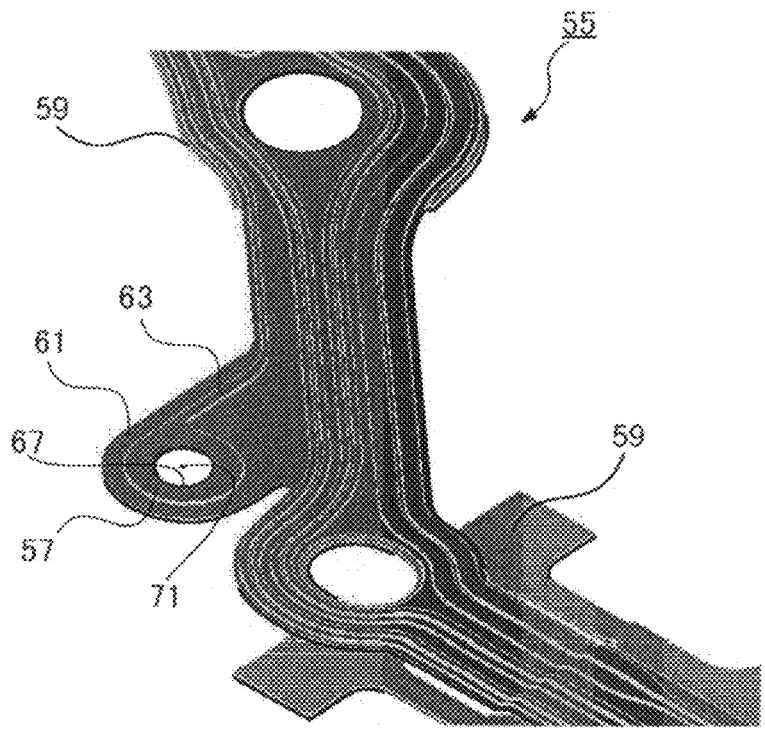
Figure 5B:
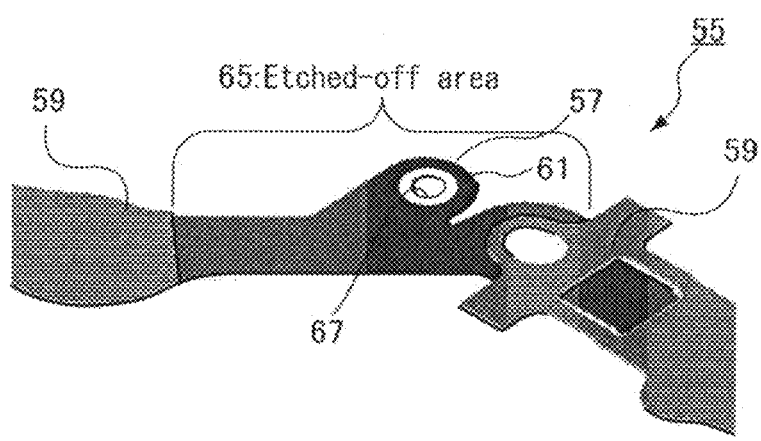

FIGS. 5(a) and 5(b) are views illustrating the details of a wiring member 55 of the flexure 39, in which FIG. 5(a) is a view seen from below the head suspension 31 and FIG. 5(b) is a view seen from the piezoelectric actuator 11.

When assembling the head suspension 31, the piezoelectric element 13 is positioned with respect to an inner circumferential face of the opening 43. As a result, the central part of the common electrode 19 of the piezoelectric element 13 faces the terminal 57 of the flexure 39 as illustrated in FIGS. 4, 5(a), and 5(b). The terminal 57 is annular and is connected to wiring 63 on the wiring member 55 of the flexure 39. Between the terminal 57 of the flexure 39 and the common electrode 19 of the piezoelectric element 13, there is a gap of several tens of micrometers.

The wiring member 55 supplies electricity to the piezoelectric element 13 and transmits read/write signals to and from the magnetic head of the head suspension 31. As illustrated in FIG. 5(a), the wiring member 55 has a three-layer structure including a conductive base 59 (an SUS base of the flexure 39), an electric insulating layer 61 formed on the conductive base 59, and the wiring 63 made of, for example, copper wires arranged on the insulating layer 61. The wiring 63 is connected to the terminal 57. As illustrated in FIG. 5(b), an area 65 of the wiring member 55 that faces the common electrode 19 of the piezoelectric element 13 has no conductive base. Namely, in the area 65, the conductive base 59 is removed by etching and the terminal 57 is arranged in the area 65 in such a way as to prevent a short-circuit failure between the common electrode 19 and the conductive base 59 of the flexure 39.

Characteristic parts of the embodiments of the present invention will be explained. To make it easy to understand the characteristic parts, comparative examples of electrical connecting structures and electrical connecting methods for electrically connecting the terminal 57 and common electrode 19 to each other will be explained.

FIGS. 6(A2) and 6(A3) are views illustrating an electrical connecting structure for a piezoelectric element according to the comparative example 1, in which FIG. 6(A2) is a sectional view after connection and FIG. 6(A3) is a plan view after connection.

As illustrated in FIG. 6(A2), the electrical connecting structure of the comparative example 1 fills the small gap between the terminal 57 of the wiring member 55 of the flexure 39 and the common electrode 19 of the piezoelectric element 13 with a conductive part 71a to secure electrical connection between them.

The terminal 57 of the wiring member 55 of the flexure 39 has a terminal hole 67 that is formed through the terminal 57 and the electric insulating layer 61 of the wiring member 55 of the flexure 39 has an insulating layer hole 68 that is formed through the insulating layer 61. The wiring member 55 is arranged so that the insulating layer 61 faces the common electrode 19 of the piezoelectric element 13. Between the common electrode 19 and the terminal 57, an annular liquid stopper 69 is interposed around the insulating layer hole 68. In this state, a liquid conductive adhesive 71 is injected into the terminal hole 67 of the terminal 57 from above (i.e., from the disk side) and is hardened.

This forms the conductive part 71a that extends from the terminal hole 67 to the surface of the common electrode 19 through the insulating layer hole 68, to electrically connect the terminal 57 and the common electrode 19 to each other.

According to the electrical connecting structure of the comparative example 1, the conductive adhesive 71 swells upward from the top of the terminal 57 to cause a clearance problem with respect to a rotary magnetic disk (not illustrated) that faces the terminal 57.

FIGS. 6(B1) to 6(B3) are views illustrating an electrical connecting structure for a piezoelectric element according to the comparative example 2, in which FIG. 6(B1) is a sectional view before connection, FIG. 6(B2) is a sectional view after connection, and FIG. 6(B3) is a plan view after connection.

The comparative example 2 covers the terminal hole 67 formed through the terminal 57 with a lid 91. The lid 91 is beforehand laid on the terminal 57 that is on the insulating layer 61. As illustrated in FIG. 6(B1), a liquid conductive adhesive 71 is injected from below (from the insulating layer 61 side) into the terminal hole 67 through the insulating layer hole 68 up to the terminal 57. Thereafter, the wiring member 55 is pressed to the common electrode 19 of the piezoelectric element 13 as illustrated in FIG. 6(B2), so that the conductive adhesive 71 hardens to form a conductive part 71a to connect the common electrode 19 and terminal 57 to each other.

According to the electrical connecting structure of the comparative example 2, the top of the terminal 57 is covered with the lid 91, and therefore, the conductive adhesive 71 will not swell from the terminal 57 toward the disk side. This seems to solve the clearance problem with respect to a rotary magnetic disk.

The comparative example 2, however, injects the conductive adhesive 71 into the terminal hole 67 up to the bottom face of the lid 91, and then, presses the wiring member 55 to the piezoelectric element 13. As a result, compared with the comparative example 1 that arranges the wiring member 55 on the piezoelectric element 13 at first, and then, injects the conductive adhesive 71 into the terminal hole 67, the comparative example 2 hardly makes the wiring member 55 and piezoelectric element 13 to be parallel to each other.

FIGS. 6(C1) to 6(C3) are views illustrating the comparative example 2 with the wiring member 55 and piezoelectric element 13 are not in parallel with each other, in which FIG. 6(C1) is a sectional view before connecting the wiring member 55, FIG. 6(C2) is a sectional view after connecting the wiring member 55, and FIG. 6(C3) is a plan view after connecting the wiring member 55. FIGS. 6(D1) to 6(D3) are views illustrating the comparative example 2 with the injected conductive adhesive 71 is biased, in which FIG. 6(D1) is a sectional view before connecting the wiring member 55, FIG. 6(D2) is a sectional view after connecting the wiring member 55, and FIG. 6(D3) is a plan view after connecting the wiring member 55.

As illustrated in FIGS. 6(C1) to 6(C3), the comparative example 2 has a risk of obliquely pressing the wiring member 55 to the piezoelectric element 13, so that the conductive adhesive 71 is cured in a biased state.

As illustrated in FIGS. 6(D1) to 6(D3), the comparative example 2 has another risk of injecting the conductive adhesive 71 at a position that is deviated from the terminal hole 67. In this case, the conductive adhesive 71 is cured in a biased state even if the wiring member 55 is pressed in parallel to the piezoelectric element 13.

If the conductive adhesive 71 on the bottom face of the wiring member 55 is biased, an insufficient bonding strength will occur to cause detachment, or an oblique attachment will occur to cause the clearance problem.

To solve these problems, the present invention forms the through hole 93 (93a, 93b, 93c, 93d) substantially at the center of the piezoelectric element 13 and injects a liquid conductive adhesive 71 into the through hole 93 from the opposite side of the common electrode 19, i.e., from the second end face of the piezoelectric element 13.

The characteristic parts of electrical connecting structures and methods according to the embodiments of the present invention will be explained in detail with reference to FIGS. 7(A1) to 7(D3).

The electrical connecting structures illustrated in these drawings have through holes 93 of different shapes, respectively.

First, the electrical connecting structure according to the embodiment illustrated in FIGS. 7(A1) to 7(A3) will be explained. FIG. 7(A1) is a sectional view before injecting a conductive adhesive, FIG. 7(A2) is a sectional view after injecting the conductive adhesive, and FIG. 7(A3) is a plan view after injecting the conductive adhesive.

According to the embodiment, a through hole 93a includes a large diameter part 101 and a small diameter part 103 is formed through the piezoelectric element 13. The large and small diameter parts 101 and 103 have cylindrical shapes having different diameters and are successively formed from the second end face of the piezoelectric element 13. The small diameter part 103 is formed through the first end face of the piezoelectric material portion 21 and the common electrode 19. Around the small diameter part 103, the large diameter part 101 defines a thin part 105.

The wiring member 55 of the flexure 39 involves the insulating layer hole 68 formed through the electric insulating layer 61 and the terminal hole 67 formed through the terminal 57. The insulating layer hole 68 and terminal hole 67 are concentric and have the same diameter, which is smaller than the diameter of the small diameter part 103 of the through hole 93a.

A disk-side surface of the terminal 57 is covered with a lid 91 to close a disk-side opening of the terminal hole 67.

To connect the common electrode 19 of the piezoelectric element 13 and the terminal 57 of the flexure 39 to each other, the electric insulating layer 61 of the wiring member 55 is set to face the common electrode 19 before injecting the conductive adhesive 71, as illustrated in FIG. 7(A1). At this time, the terminal 57 and terminal hole 67 on the insulating layer 61 are exposed through the insulating layer hole 68 to the common electrode 19. The insulating layer 61 and common electrode 19 are set to be parallel to each other with a predetermined gap being kept between them. The insulating layer hole 68 and terminal hole 67 are set to be concentric with the small diameter part 103.

In FIG. 7(A2), the conductive adhesive 71 is injected into the through hole 93a of the piezoelectric element 13 from a bottom opening of the large diameter part 101, i.e., from the second end face side of the piezoelectric element 13 opposite to the side where the wiring member 55 is laid. At this time, the parallelism of the piezoelectric element 13 and wiring member 55 is easily achieved because the wiring member 55 is beforehand arranged with respect to the piezoelectric element 13.

The injected conductive adhesive 71 fills the large diameter part 101 of the through hole 93a and then the small diameter part 103 thereof and reaches the wiring member 55 of the flexure 39. In the small diameter part 103, the conductive adhesive 71 contacts the common electrode 19.

The conductive adhesive 71 flows out of the through hole 93a, fills the terminal hole 67 of the terminal 57, contacts the terminal 57, and fills the insulating layer hole 68 of the electric insulating layer 61. At the same time, the conductive adhesive 71 enters the gap between the insulating layer 61 and the common electrode 19. In this gap, the conductive adhesive 71 contacts the surface of the common electrode 19 out of the through hole 93a and forms an outer expansion 107 that expands outward along the thin part 105.

When the conductive adhesive 71 is injected, a hollow of the large diameter part 101 of the through hole 93a serves as a pool of the conductive adhesive 71. As a result, the conductive adhesive 71 forms in the large diameter part 101 an inner expansion 109 that expands outward along the thin part 105. The inner expansion 109 spherically swells from the thin part 105 in a thickness direction. The large diameter part 101 has a large opening on the conductive adhesive 71 injecting side of the through hole 93a, so that the conductive adhesive 71 is easily injected into the through hole 93a.

The injected conductive adhesive 71 hardens to form the electrical connecting structure including the conductive part 71a. According to the electrical connecting structure prepared according to the electrical connecting method, the conductive part 71a extends from the through hole 93a formed through the piezoelectric element 13 including the common electrode 19 to the terminal 57, and therefore, the conductive part 71a bonds the common electrode 19 and terminal 57 together and electrically connects them to each other.

According to this electrical connecting structure, the outer expansion 107 and inner expansion 109 of the conductive part 71a hold the thin part 105 and piezoelectric element 13 from each side.

The electrical connecting structure according to the embodiment illustrated in FIGS. 7(B1) to 7(B3) will be explained. FIG. 7(B1) is a sectional view before injecting a conductive adhesive, FIG. 7(B2) is a sectional view after injecting the conductive adhesive, and FIG. 7(B3) is a plan view after injecting the conductive adhesive.

This embodiment employs a through hole 93b instead of the through hole 93a of the embodiment of FIGS. 7(A1) to 7(A3). The through hole 93b has a truncated conical shape having gradually changing diameters that become minimum at the first end face of the piezoelectric element 13. The through hole 93b forms an acute corner 111 on the piezoelectric element 13.

The truncated conical through hole 93b is easy to manufacture compared with the through hole 93a. The through hole 93b has a large opening on the adhesive injecting side, and therefore, the conductive adhesive 71 is easily injected into the through hole 93b.

The injected conductive adhesive 71 forms a conductive part 71a that extends from the through hole 93b to the terminal 57, to bond the common electrode 19 and terminal 57 together and electrically connect them to each other.

The conductive part 71a forms an outer expansion 107 and an inner expansion 109b, to hold the corner 111 of the piezoelectric element 13 from each side.

The electrical connecting structure according to the embodiment illustrated in FIGS. 7(C1) to 7(C3) will be explained. FIG. 7(C1) is a sectional view before injecting a conductive adhesive, FIG. 7(C2) is a sectional view after injecting the conductive adhesive, and FIG. 7(C3) is a plan view after injecting the conductive adhesive.

This embodiment employs a through hole 93c instead of the through hole 93b of the embodiment of FIGS. 7(B1) to 7(B3). The through hole 93c has a truncated conical shape having gradually changing diameters that become maximum at the first end face of the piezoelectric element 13.

The through hole 93c of the truncated conical shape has a narrow opening on the adhesive injecting side. Accordingly, when the conductive adhesive 71 is injected into the through hole 93c from below as illustrated in FIG. 7(C2), the conductive adhesive easily stays in the through hole 93c due to the surface tension.

Irrespective of the shape of the through hole 93, the conductive adhesive 71 is injected from below as illustrated in FIGS. 7(A1) to 7(D3), or may be injected from above after inverting the arranged piezoelectric element 13 and wiring member 55 upside down.

In FIG. 7(C2), the injected conductive adhesive 71 forms a conductive part 71a that extends from the through hole 93c to the terminal 57, to bond the common electrode 19 and terminal 57 together and electrically connect them to each other.

The electrical connecting structure according to the embodiment illustrated in FIGS. 7(D1) to 7(D3) will be explained. FIG. 7(D1) is a sectional view before injecting a conductive adhesive, FIG. 7(D2) is a sectional view after injecting the conductive adhesive, and FIG. 7(D3) is a plan view after injecting the conductive adhesive.

This embodiment employs a through hole 93d instead of the through hole 93c of the embodiment of FIGS. 7(C1) to 7(C3). The through hole 93d has a cylindrical shape having substantially the same diameter.

The through hole 93d of the simple cylindrical structure is easy to manufacture and is strong.

When a conductive adhesive 71 is injected into the through hole 93d, it forms a conductive part 71a that extends from the through hole 93d to the terminal 57, to bond the common electrode 19 and terminal 57 together and electrically connect them to each other.

The electrical connecting structures according to the embodiments illustrated in FIGS. 8(A1) to 8(B3) will be explained. These embodiments differ from the embodiments of FIGS. 7(A1) to 7(D3) in the shape of the terminal 57.

Among FIGS. 8(A1) to 8(A3), FIG. 8(A1) is a sectional view before injecting a conductive adhesive, FIG. 8(A2) is a sectional view after injecting the conductive adhesive, and FIG. 8(A3) is a plan view after injecting the conductive adhesive. Among FIGS. 8(B1) to 8(B3), FIG. 8(B1) is a sectional view before injecting a conductive adhesive, FIG. 8(B2) is a sectional view after injecting the conductive adhesive, and FIG. 8(B3) is a plan view after injecting the conductive adhesive.

Unlike the embodiments of FIGS. 7(A1) to 7(D3) according to which the terminal 57 has the terminal hole 67, the terminal 57 of each embodiment illustrated in FIGS. 8(A1) to 8(B3) has no terminal hole 67 and has a disk-like shape that is easy to manufacture.

Also, unlike the embodiments of FIGS. 7(A1) to 7(D3), the embodiments of FIGS. 8(A1) to 8(B3) each have an insulating filler 97 that covers a conductive adhesive 71 in the through hole 93d, to prevent the conductive adhesive 71 from coming off from the bottom of the through hole 93d. Namely, the insulating filler 97 prevents the conductive adhesive 71 (conductive part 71a) from dropping through the bottom opening of the through hole 93d and scattering within a magnetic disk drive to damage a rotary magnetic disk or cause a short circuit with respect to the first and second electrodes 15 and 17. The insulating filler 97 may be made of insulating polymeric material such as epoxy resin, or ceramic material.

The embodiment illustrated in FIGS. 8(B1) to 8(B3) has no lid 91. This simplifies the manufacturing of the wiring material 55.

In this way, each embodiment of the present invention forms the through hole 93 through the piezoelectric element 13 including the common electrode 19, injects the conductive adhesive 71 into the through hole 93 from the opposite side of the common electrode 19 on which the terminal 57 is arranged, and hardens the injected conductive adhesive 71 to mechanically and electrically connect the common electrode 19 and terminal 57 to each other.

Consequently, each embodiment of the present invention is capable of preventing a deviation of the conductive adhesive 71 or nonparallelism between the piezoelectric element 13 and the terminal 57 after bonding them together. If the terminal 57 and piezoelectric element 13 are obliquely bonded to each other, bonding strength will be insufficient and a clearance relative to a facing rotary magnetic disk will be improper. These problems will not occur in each embodiment of the present invention.

The through hole 93 is used not only to inject the conductive adhesive 71 between the common electrode 19 of the piezoelectric element 13 and the terminal 57 but also to hold an excess of the conductive adhesive 71. This produces a margin in controlling an injection quantity of the conductive adhesive 71 and makes it easy to automate the injection of the conductive adhesive 71. In addition, the through hole 93 prevents an excess of the conductive adhesive 71 from oozing to cause a short circuit.

According to the embodiments of FIGS. 7(D1) to 7(D3) and 8(A1) to 8(B3), the through hole 93d has a cylindrical shape having a uniform diameter. Accordingly, the through hole 93d is easy to manufacture and provides high strength. According to the embodiments of FIGS. 7(B1) to 7(C3), the through hole 93b (93c) has a truncated conical shape, so that a conductive adhesive is easily injected into the through hole 93b (93c) even from an oblique direction. According to the embodiment of FIGS. 7(A1) to 7(A3), the through hole 93a has a combinational shape of cylinders having different diameters, to provide a combinational effect of the above-mentioned embodiments and easily control a volume for holding an excess of the conductive adhesive 71.

Each embodiment of the present invention arranges the terminal 57 on the electric insulating layer 61 of the flexure 39 that faces the common electrode 19 of the piezoelectric element 13 and removes a part of the conductive base 59 of the flexure 39 that faces the common electrode 19. This configuration prevents any part of the flexure 39 except the terminal 57 from electrically contacting the common electrode 19 of the piezoelectric element 13, thereby avoiding a short circuit or the generation of noise. The terminal 57 is arranged on the flexure 39, and due to the flexibility of the flexure 39, connection of the terminal 57 to the common electrode 19 will not be broken even when the piezoelectric element 13 vibrates.

The electrical connecting structure according to any embodiment of the present invention secures electrical connection between the common electrode 19 of the piezoelectric element 13 and the terminal 57 with a proper bonding strength without mechanically stressing the piezoelectric element 13. Accordingly, each embodiment of the present invention is capable of carrying out wiring to the piezoelectric element 13 without deteriorating the productivity and reliability of the piezoelectric element 13.

Although the present invention has been explained with reference to the embodiments, the embodiments are not intended to restrict the present invention. The embodiments are modifiable without departing from the scope and technical idea of the present invention stipulated or suggested in the claims and specification. Electrical connecting structures and electrical connecting methods for piezoelectric elements, piezoelectric actuators, and head suspensions according to such modifications also fall in the scope of the present invention.

The base or the base plate mentioned in the claims conceptually includes the base plate 33 and actuator plate 34. Accordingly, the base or the base plate stipulated in the claims may be read as an actuator plate. For example, an opening formed in the base plate may be read as an opening formed in the actuator plate.

According to the embodiments of the present invention, the piezoelectric actuator 11 is arranged between the base plate 33 and the load beam 35. This arrangement does not limit the present invention.

The present invention is applicable to any structure that includes a piezoelectric actuator between a base part and a head part. For example, the present invention is applicable to a structure that arranges a piezoelectric actuator on a carriage arm (an actuator arm), to minutely move a head suspension, a magnetic head slider, or a magnetic head element.

Figure 9:
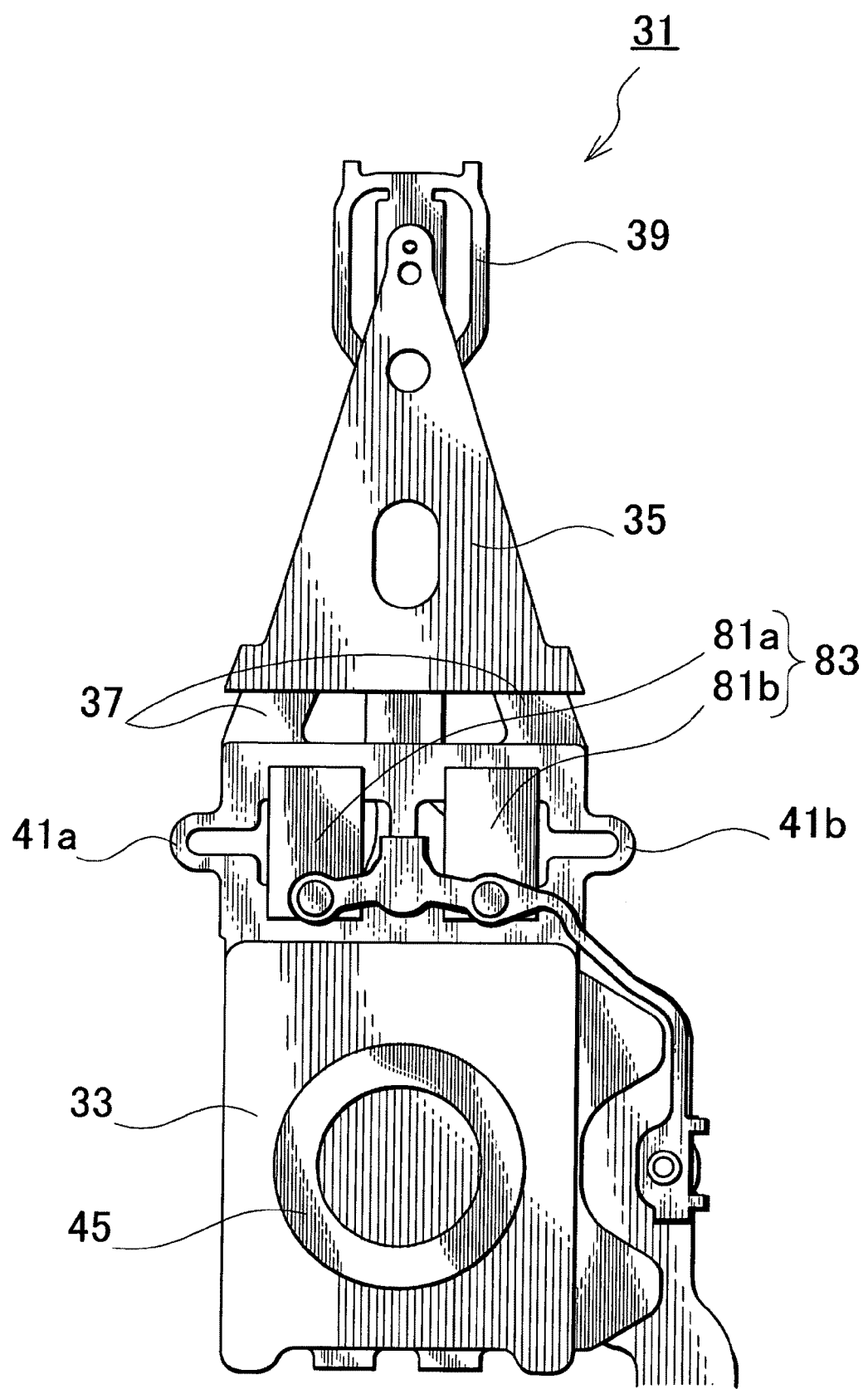
FIG. 9 is a general view illustrating a head suspension according to a modification of the present invention.

According to the embodiments of the present invention, the piezoelectric actuator 11 employs one piezoelectric element 13 to which the electrical connecting structure according to the present invention is applied. This does not limit the present invention. The piezoelectric actuator may comprise a plurality of separate piezoelectric elements. For example, a piezoelectric actuator 83 according to a modification of the present invention illustrated in FIG. 9 employs a pair of piezoelectric elements 81a and 81b and each of the piezoelectric elements 81a and 81b employs the electrical connecting structure of the present invention.

What is claimed is:

1. An electrical connecting structure for a piezoelectric element, the piezoelectric element being arranged between a base and head of an object, configured to minutely move the head in a sway direction when deformed with an applied voltage, and having a first end face and a second end face opposite to the first end face, the electrical connecting structure comprising:

a terminal used to apply a voltage to the piezoelectric element;

an electrode formed on the first end face of the piezoelectric element and facing the terminal;

a through hole formed through the piezoelectric element from the electrode on the first end face to the second end face of the piezoelectric element;

a conductive part formed by hardening a liquid conductive material extending from an inside of the through hole to the terminal, to join the electrode and terminal together and electrically connect the electrode and terminal to each other; and the through hole having openings on the first and second end faces of the piezoelectric element and a large diameter part formed between the openings so that a diameter of the opening on the second end face is larger than a diameter of the opening on the first end face through the large diameter part; and the conductive part extending from the large diameter part to the terminal and protruding out of only the opening on the first end face of the piezoelectric element.

2. The electrical connecting structure of claim 1, wherein the through hole of the piezoelectric element has a shape selected from a combination of cylindrical shapes having different diameters and a truncated cone shape having gradually changing diameters.

3. An electrical connecting method for the electrical connecting structure of claim 1, comprising:

facing the terminal to the electrode on the first end face of the piezoelectric element; and injecting a liquid conductive adhesive into the through hole from the second end face side of the piezoelectric element and hardening the injected liquid conductive adhesive to join the electrode and terminal together.

4. A piezoelectric actuator comprising a piezoelectric element having the electrical connecting structure of claim 1.

5. A head suspension comprising the piezoelectric actuator of claim 4, a base plate, a load beam attached to the base plate, and a flexure attached to the load beam, the piezoelectric actuator being arranged between the base plate and the flexure, to minutely move a front end of the load beam in a sway direction when deformed with an applied voltage.

6. An electrical connecting structure for a piezoelectric element, the piezoelectric element being arranged between a base and head of an object, configured to minutely move the head in a sway direction when deformed with an applied voltage, and having a first end face and a second end face opposite to the first end face, the electrical connecting structure comprising:

a terminal used to apply a voltage to the piezoelectric element;

an electrode formed on the first end face of the piezoelectric element;

a through hole formed through the piezoelectric element from the electrode on the first end face to the second end face of the piezoelectric element;

a conductive part formed from within the through hole to the terminal, to join the electrode and terminal together and electrically connect the electrode and terminal to each other; and an electric insulating layer that is arranged to face the electrode on the first end face of the piezoelectric element and on which the terminal is arranged; and a hole formed on the electric insulating layer to expose the terminal to the electrode on the first end face of the piezoelectric element.

7. The electrical connecting structure of claim 6, further comprising:

a wiring member including a conductive base, an electric insulating layer formed on the conductive base, and wiring formed on the electric insulating layer;

the terminal arranged on the wiring member; and the conductive base of the wiring member partly removed at a location that faces the electrode on the first end face of the piezoelectric element.

8. The electrical connecting structure of claim 6, wherein the through hole of the piezoelectric element has a larger diameter than the hole of the electric insulating layer.

9. The electrical connecting structure of claim 8, further comprising:

a hole formed on the terminal, the hole communicating with, being concentric with, and having the same diameter as the hole of the electric insulating layer.

10. The electrical connecting structure of claim 6, further comprising:

a hole formed on the terminal, the hole communicating with, being concentric with, and having the same diameter as the hole of the electric insulating layer.

11. The electrical connecting structure of claim 6, wherein the through hole of the piezoelectric element has a shape selected from a cylindrical shape having a uniform diameter, a combination of cylindrical shapes having different diameters, and a truncated cone shape having gradually changing diameters.

12. An electrical connecting method for the electrical connecting structure of claim 6, comprising:

facing the terminal to the electrode on the first end face of the piezoelectric element; and injecting a liquid conductive adhesive into the through hole from the second end face side of the piezoelectric element and hardening the injected liquid conductive adhesive to join the electrode and terminal together.

13. A piezoelectric actuator comprising a piezoelectric element having the electrical connecting structure of claim 6.

14. A head suspension comprising the piezoelectric actuator of claim 13, a base plate, a load beam attached to the base plate, and a flexure attached to the load beam, the piezoelectric actuator being arranged between the base plate and the flexure, to minutely move a front end of the load beam in a sway direction when deformed with an applied voltage.

15. An electrical connecting structure for a piezoelectric element, the piezoelectric element being arranged between a base and head of an object, configured to minutely move the head in a sway direction when deformed with an applied voltage, and having a first end face and a second end face opposite to the first end face, the electrical connecting structure comprising:

a terminal used to apply a voltage to the piezoelectric element;

an electrode formed on the first end face of the piezoelectric element and facing the terminal;

a through hole formed through the piezoelectric element from the electrode on the first end face to the second end face of the piezoelectric element;

a conductive part formed by hardening a liquid conductive material extending from an inside of the through hole to the terminal, to join the electrode and terminal together and electrically connect the electrode and terminal to each other;

the through hole having openings on the first and second end faces of the piezoelectric element and a small diameter part formed between the openings so that a diameter of the opening on the second end face is smaller than a diameter of the opening on the first end face through the small diameter part; and the conductive part extending from the small diameter part to the terminal and protruding out of only the opening on the first end face of the piezoelectric element.

16. The electrical connecting structure of claim 15, wherein the through hole of the piezoelectric element has a truncated cone shape having gradually changing diameters.

17. An electrical connecting method for the electrical connecting structure of claim 15, comprising:
- facing the terminal to the electrode on the first end face of the piezoelectric element; and
- injecting a liquid conductive adhesive into the through hole from the second end face side of the piezoelectric element and hardening the injected liquid conductive adhesive to join the electrode and terminal together.

18. A piezoelectric actuator comprising a piezoelectric element having the electrical connecting structure of claim 15.

19. A head suspension comprising the piezoelectric actuator of claim 18, a base plate, a load beam attached to the base plate, and a flexure attached to the load beam, the piezoelectric actuator being arranged between the base plate and the flexure, to minutely move a front end of the load beam in a sway direction when deformed with an applied voltage.

\* \* \* \* \*